(12) United States Patent
Nagai

(10) Patent No.: US 7,847,307 B2
(45) Date of Patent: Dec. 7, 2010

(54) LIGHT-EMITTING MODULE

(75) Inventor: Hideo Nagai, Osaka (JP)

(73) Assignee: Panasonic Corporation, Osaka (JP)

( * ) Notice: Subject to any disclaimer, the term of this patent is extended or adjusted under 35 U.S.C. 154(b) by 793 days.

(21) Appl. No.: 11/813,078

(22) PCT Filed: Mar. 22, 2006

(86) PCT No.: PCT/JP2006/306399
§ 371 (c)(1), (2), (4) Date: Jun. 28, 2007

(87) PCT Pub. No.: WO2006/101257
PCT Pub. Date: Sep. 28, 2006

(65) Prior Publication Data
US 2010/0032697 A1  Feb. 11, 2010

(30) Foreign Application Priority Data
Mar. 23, 2005  (JP) .............................. 2005-084658

(51) Int. Cl.
*H01L 33/00* (2010.01)
*G01C 15/06* (2006.01)
(52) U.S. Cl. .......... 257/98; 257/E33.061; 257/E33.067; 362/294
(58) Field of Classification Search .................. 257/98, 257/99, 100, 88, E33.061, E33.067, 79, 13, 257/82; 362/231, 240, 241, 294, 373
See application file for complete search history.

(56) References Cited

U.S. PATENT DOCUMENTS

| | | | |
|---|---|---|---|
| 6,346,719 B1 * | 2/2002 | Udagawa et al. ............... | 257/94 |
| 6,498,355 B1 | 12/2002 | Harrah et al. | |
| 2003/0230751 A1 * | 12/2003 | Harada ......................... | 257/80 |
| 2004/0027067 A1 | 2/2004 | Song et al. | |
| 2004/0065889 A1 | 4/2004 | Ueda et al. | |
| 2004/0144987 A1 * | 7/2004 | Ouderkirk et al. .............. | 257/98 |
| 2004/0182929 A1 * | 9/2004 | Aoshima et al. ............. | 235/454 |
| 2006/0220050 A1 * | 10/2006 | Higaki et al. .................. | 257/99 |

FOREIGN PATENT DOCUMENTS

EP  1 416 219  5/2004

(Continued)

*Primary Examiner*—Thomas L Dickey
*Assistant Examiner*—Nikolay Yushin
(74) *Attorney, Agent, or Firm*—Hamre, Schumann, Mueller & Larson, P.C.

(57) ABSTRACT

A light-emitting module (1) includes: a package (10); a base board (13) and a semiconductor multi-layered film (50) accommodated in the package (10); and a plurality of terminal portions (16) for supplying electricity to the semiconductor multi-layered film (50), wherein the package (10) includes a metallic support portion (11*b*) supporting the base board (13), a plurality of through-holes (11*c*) for insertion of the respective terminal portions (16), an insulating member (11*d*) keeping electrical insulation between the metallic support portion (11*b*) and the terminal portions (16), and between the respective terminal portions (16), and a window portion (12*a*); the base board (13) is made of an inorganic heat-dissipating material that keeps electrical insulation between the semiconductor multi-layered film (50) and the metallic support portion (11*b*); and one opening of each of the through-holes (11*c*) is provided on a side surface of the package (10).

19 Claims, 9 Drawing Sheets

FOREIGN PATENT DOCUMENTS

| | | |
|---|---|---|
| EP | 1 659 642 | 5/2006 |
| JP | 62-235787 | 10/1987 |
| JP | 2003-124528 | 4/2003 |
| JP | 2003-301788 * | 8/2003 |
| JP | 2004-14938 | 1/2004 |
| WO | 2005/020338 | 8/2004 |

* cited by examiner

LIGHT-EMITTING MODULE

TECHNICAL FIELD

The present invention relates to a light-emitting module.

BACKGROUND ART

A light-emitting diode (LED) chip including a semiconductor multi-layered film is used for a light source for a backlight of liquid crystal, an indicator such as a meter, a light source for a display, a light source for a read sensor, or the like. In particular, recently, owing to the increase in the optical output of an LED chip and the decrease in a wavelength of light taken out from the LED chip, it is considered to apply the LED chip as an illumination light source. For example, JP 2003-124528 A proposes a light-emitting module capable of realizing high optical output by mounting a number of LED chips on a card-shaped substrate at high density.

The LED chip generates a great amount of heat during use, so that some heat-dissipating means generally is used when applying the LED chip to a light-emitting module. For example, in the light-emitting module in the above-mentioned JP 2003-124528 A, an LED chip is mounted on a metal substrate via an electrical insulating layer made of an organic material, whereby the heat generated from the LED chip is dissipated from the metal substrate via the electrical insulating layer. However, according to this heat-dissipating means, the organic material constituting the electrical insulating layer is degraded due to the heat and light generated by the LED chip, with the result that cracks may be generated in the electrical insulating layer. In the case where cracks are generated in the electrical insulating layer, a leakage current is generated via the cracks when the LED chip is supplied with electricity. Therefore, it may become impossible to allow the LED chip to emit light.

DISCLOSURE OF INVENTION

The present invention solves the above-mentioned conventional problem, and its object is to provide a light-emitting module that is capable of maintaining heat dissipation and has high heat resistance and high light stability.

A light-emitting module of the present invention includes: a package; a base board and a semiconductor multi-layered film accommodated in the package; and a plurality of terminal portions for supplying electricity to the semiconductor multi-layered film.

The semiconductor multi-layered film includes a light-emitting layer and is provided on the base board. The package includes a metallic support portion supporting the base board, a plurality of through-holes for insertion of the respective terminal portions, an insulating member keeping electrical insulation between the metallic support portion and the terminal portions, and between the respective terminal portions, and a window portion through which at least a part of light emitted from the light-emitting layer passes, the base board is made of an inorganic heat-dissipating material that keeps electrical insulation between the semiconductor multi-layered film and the metallic support portion, and one opening of each of the through-holes is provided on a side surface of the package.

BRIEF DESCRIPTION OF DRAWINGS

FIGS. 2A and 2B are enlarged cross-sectional views showing a variation in an X-portion in FIG. 1C; FIGS. 2C and 2D are enlarged cross-sectional views showing a variation in a Y-portion in FIG. 1C; and FIGS. 2E to 2G are enlarged cross-sectional views showing a variation in a Z-portion in FIG. 1C.

FIG. 3A is a top view of a socket; FIG. 3B is a side view thereof; FIG. 3C is a top view showing a state where the light-emitting module according to Embodiment 1 is inserted in the socket; and FIG. 3D is a side view showing a state where the light-emitting module according to Embodiment 1 is inserted in the socket in FIG. 3B.

FIG. 6A is a top view of a socket; FIG. 6B is a top view showing a state where the light-emitting module according to Embodiment 3 is inserted in the socket in FIG. 6A; FIG. 6C is a top view showing a state where a pressure cover further is attached to the state in FIG. 6B; and FIG. 6D is a cross-sectional view taken along a line IV-IV in FIG. 6C.

FIG. 8A is a top view of the light-emitting apparatus, and FIG. 8B is a side view thereof.

DESCRIPTION OF THE INVENTION

Figure 1A:
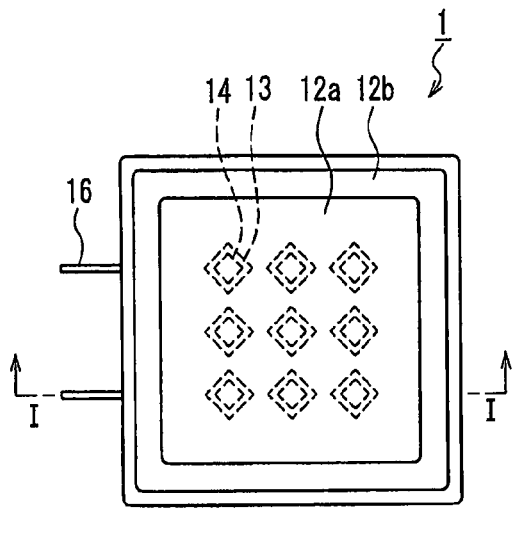
FIG. 1A is a top view of a light-emitting module according to Embodiment 1 of the present invention.

A light-emitting module of the present invention includes a package, a base board and a semiconductor multi-layered film accommodated in the package, and a plurality of terminal portions for supplying electricity to the semiconductor multi-layered film. Furthermore, the semiconductor multi-layered film includes a light-emitting layer, and is provided on the base board.

As the semiconductor multi-layered film, for example, the one having a diode structure can be used in which a first conductivity type layer, a light-emitting layer, and a second conductivity type layer are stacked in this order. As the first conductivity type layer, for example, a p-type semiconductor layer such as a p-GaN layer or a p-AlGaInN layer, or an n-type semiconductor layer such as an n-GaN layer or an n-AlGaInN layer can be used. Although the light-emitting layer is not particularly limited, it is preferable to use a light-emitting layer capable of emitting light having a wavelength of 200 nm to 540 nm (in particular, 200 nm to 400 nm), because the effect (for example, light stability) of the present invention can be exhibited efficiently. An example of the light-emitting layer includes an AlGaInN multiple quantum well light-emitting layer. The second conductivity type layer need only have a conductivity opposite to that of the first conductivity type layer, and for example, a p-type semiconductor layer such as a p-GaN layer or a p-AlGaInN layer, or an n-type semiconductor layer such as an n-GaN layer or an n-AlGaInN layer can be used. Furthermore, as a constituent element of the semiconductor multi-layered film, a material other than a GaN-based material (e.g., a ZnS-based material or a ZnO-based material) may be used. Even in the case of using a material other than a GaN-based material, it is preferable to use a semiconductor multi-layered film including a light-emitting layer that emits light having a wavelength of 200 nm to 540 nm in the same way as in the above, because the effect (e.g., light stability) of the present invention is exhibited efficiently. The thickness of the p-type semiconductor layer, the light-emitting layer, and the n-type semiconductor layer may be set to be, for example, 0.1 to 0.5 µm, 0.01 to 0.1 m, and 0.5 to 3 µm, respectively. The first conductivity type layer, the light-emitting layer, and the second conductivity type layer respectively may be formed of a single layer or a plurality of layers. In the case where they are formed of a plurality of layers, constituent layers may be made of different materials.

A constituent element of the terminal portion is not particularly limited as long as it is capable of supplying electricity to the semiconductor multi-layered film. For example, metal such as iron, copper, or an alloy containing them can be used. Furthermore, in order to ensure the connection by wire bonding, a core material made of the above-mentioned metal whose surface is plated with gold also can be used as the terminal portion. Furthermore, the shape of the terminal portion is not particularly limited, and for example, the terminal portion may be in a bar shape, a plate shape, or the like. In the case of using a bar-shaped terminal portion, the diameter thereof may be, for example, about 0.3 to 1 mm. Furthermore, the number of the terminal portions is not particularly limited, and at least a pair of terminal portions (terminal portion on a p-type semiconductor layer side and a terminal portion on an n-type semiconductor layer side) may be provided.

The package accommodating the base board and the semiconductor multi-layered film includes a metallic support portion supporting the base board, a plurality of through-holes through which each terminal portion is inserted, an insulating member keeping electrical insulation between the metallic support portion and the terminal portions, and between the respective terminal portions, and a window portion through which at least a part of light emitted from the light-emitting layer passes.

The base board is made of an inorganic heat-dissipating material that keeps electrical insulation between the semiconductor multi-layered film and the metallic support portion. This can electrically insulate the semiconductor multi-layered film and the metallic support portion from each other, and dissipate heat generated from the semiconductor multi-layered film through the base board and the metallic support portion. Furthermore, the base board is made of an inorganic material, so that a light-emitting module having high heat resistance and high light stability can be provided. As the above-mentioned inorganic heat-dissipating material, for example, an inorganic material having a heat conductivity of 100 to 500 W/(m·K) can be used. Specifically, an inorganic material such as AlN, $Al_2O_3$, high-purity Si, or high-purity SiC can be used. Furthermore, the entire base board need not necessarily be composed of an electrical insulating material, as long as the electrical insulation can be kept between the semiconductor multi-layered film and the metallic support portion. As the base board, for example, a low-resistant semiconductor Si substrate also can be used in which at least one principal plane is covered with an inorganic insulating film such as a $SiO_2$ film. The thickness of the base board is, for example, about 0.05 to 1 mm.

The number and the shape of the through-holes through which the respective terminal portions are inserted may be set in accordance with the number and the shape of the terminal portions. One opening of each through-hole is provided on a side surface of the package. This enables electricity to be supplied from the side surface of the package to the semiconductor multi-layered film. Thus, a heat dissipating member can be brought into direct contact with the surface (bottom surface) of the package on the metallic support portion side without interference from the terminal portions, so that heat dissipation can be maintained satisfactorily.

There is no particular limit to the constituent element of the insulating member keeping the electrical insulation between the metallic support portion and the terminal portions, and between the respective terminal portions, and for example, glass such as borosilicate glass can be used. Furthermore, the insulating member may be formed, for example, in an outer circumferential portion of each through-hole.

The constituent element of the window portion is not particularly limited as long as at least a part of light emitted from the light-emitting layer can pass. For example, in the case of allowing light having a wavelength of 200 nm or more to pass, quartz or AlN can be used. In the case of allowing light having a wavelength of 350 nm or more to pass, sapphire or the like can be used. Furthermore, in the case of allowing light having a wavelength of 380 nm or more, glass such as borosilicate glass can be used. The thickness of the window portion is, for example, about 0.5 to 1 mm.

Furthermore, in the light-emitting module of the present invention, the package may be formed of a base and a cap connected to the base. In this case, it is preferable that the base includes a concave portion in which at least a part of a bottom portion is made of the above-mentioned metallic support portion, the above-mentioned plurality of through-holes, and the above-mentioned insulating member, and the above-mentioned cap includes the above-mentioned window portion. According to this configuration, the semiconductor multi-layered film accommodated in the base and the terminal portions inserted in the through-holes of the base are connected electrically, and thereafter, the base and the cap are connected to assemble a light-emitting module. Therefore, the productivity of the light-emitting module is enhanced. Furthermore, the above-mentioned concave portion preferably has an inclined surface spreading to an opening side. This is because light emitted from the light-emitting layer can be reflected to the window portion side, whereby the efficiency of taking out light of the light-emitting module is enhanced.

Furthermore, the light-emitting module of the present invention may include a phosphor layer that is provided on at least a part of an inner wall of the package and absorbs at least a part of light emitted from the light-emitting layer to emit fluorescence. According to this configuration, for example, a light-emitting layer emitting blue light is combined with a phosphor layer that absorbs blue light to emit yellow light or red light, whereby white light can be taken out. Therefore, a light-emitting module suitable for a lighting apparatus can be provided. The thickness of the phosphor layer is, for example, about 20 to 500 μm.

Regarding the phosphor constituting the above-mentioned phosphor layer, examples of a phosphor excited with blue light include those that emit green light such as a garnet structure-based $Y_3(Al, Ga)_5O_{12}:Ce^{3+}$ and silicate-based $(Ba, Sr)_2SiO_4:Eu^{2+}$; those that emit yellow light such as sialon-based Ca—Al—Si—O—N:$Eu^{2+}$, silicate-based $(Sr, Ca)_2SiO_4:Eu^{2+}$, and garnet structure-based $(Y, Gd)_3Al_5O_{12}:Ee^{2+}$; and those that emit red light such as nitride silicate-based $Sr_2Si_5N_8:Eu^{2+}$, nitride aluminosilicate-based $CaAlSiN_3:Eu^{2+}$, oxonitride aluminosilicate-based $Sr_2Si_4AlON_7:Eu^{2+}$, and sulfide-based $CaS:Eu^{2+}$. Furthermore, examples of a phosphor excited with light having a wavelength of 420 nm or less include those that emit blue light such as $(Sr, Ca)_{10}(PO_4)_6Cl_2:Eu^{2+}$ and $BaMgAl_{10}O_{17}:Eu^{2+}$; those that emit green light such as $BaMgAl_{10}O_{17}:Eu^{2+}$, $BaMgAl_{10}O_{17}:Mn^{2+}$, $SrAl_2O_4:Eu^{2+}$, and silicate-based $(Ba, Sr)_2SiO_4:Eu^{2+}$, those that emit yellow light such as sialon-based Ca—Al—Si—O—N:$Eu^{2+}$ and silicate-based $(Sr, Ca)_2SiO_4:Eu^{2+}$, and those that emit red light such as nitride silicate-based $Sr_2Si_5N_8:Eu^{2+}$, nitride aluminosilicate-based $CaAlSiN_3:Eu^{2+}$, oxonitride aluminosilicate-based $Sr_2Si_4AlON_7:Eu^{2+}$, and LOS-based $La_2O_2S:Eu^{3+}$.

Furthermore, the light-emitting module of the present invention may include a metal oxide layer provided on an inner surface of the above-mentioned window portion. The metal oxide layer reflects UV-light; therefore, when the light-emitting module of the present invention is used as a visible light source, UV-light (harmful light) can be prevented from being output from the window portion. Furthermore, in the case where the light-emitting module of the present invention includes the above-mentioned phosphor layer, the light-emitting module may include a metal oxide layer interposed between at least a part of an inner wall of the above-mentioned package and the above-mentioned phosphor layer. For example, in the case where the phosphor layer includes a phosphor excited with UV-light, UV-light passing through the phosphor layer can be reflected to the phosphor layer side by the metal oxide layer, so that the excitation efficiency of the phosphor layer can be enhanced. As the metal oxide constituting the above-mentioned metal oxide layer, for example, metal oxide fine particles composed of $Al_2O_3$, $SiO_2$, ZnO, $Y_2O_8$, $TiO_2$, $ZrO_2$, $HfO_2$, $SnO_2$, $Ta_2O_5$, $Nb_2O_5$, $BaSO_4$, ZnS, $V_2O_5$, and the like can be used. Furthermore, regarding these metal oxide fine particles, one kind may be used alone, or at least two kinds may be mixed. Furthermore, in order to reflect UV-light efficiently, it is preferable that the particle diameter of the metal oxide fine particles is 0.001 to 0.5 μm. The thickness of the metal oxide layer is, for example, about 0.1 to 1 μm.

Furthermore, the light-emitting module of the present invention may include a first light reflective layer that is provided on at least a part of an inner wall of the package excluding the above-mentioned window portion, and reflects at least a part of light emitted from the above-mentioned light-emitting layer. Since the light emitted from the light-emitting layer can be reflected to the window portion side, the efficiency of taking out light of the light-emitting module is enhanced. As the first light reflective layer, for example, a plated film, a vapor-deposited film, or the like made of metal such as Ag, Au, or Al can be used. The thickness of the first light reflective layer is, for example, about 0.5 to 3 μm. In the case where the light-emitting module of the present invention includes the above-mentioned phosphor layer, the above-mentioned first light reflective layer may reflect at least a part of light emitted from the above-mentioned light-emitting layer and the above-mentioned phosphor layer.

Furthermore, the light-emitting module of the present invention may include a second light reflective layer that is interposed between the above-mentioned base board and the above-mentioned semiconductor multi-layered film, and reflects at least a part of light emitted from the light-emitting layer. Since light emitted from the light-emitting layer can be reflected to the window portion side, the effect of taking out light of the light-emitting module is enhanced. An example of a constituent element of the second light reflective layer includes Rh/Pt/Au. The thickness of the second light reflective layer is, for example, about 0.5 to 3 μm.

Furthermore, in the light-emitting module of the present invention, it is preferable that dry gas (dry air, dry nitrogen gas, dry argon, etc.) is sealed in the above-mentioned package. According to this configuration, metal migration accelerated with moisture in the package can be suppressed, so that a leakage current caused by metal migration, for example, can be suppressed. Hereinafter, embodiments of the present invention will be described in detail.

Embodiment 1

Figure 1B:
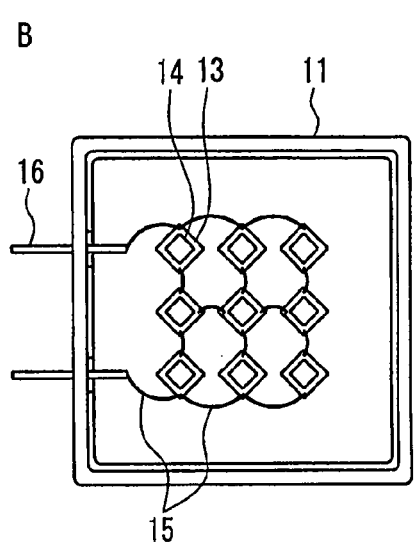
FIG. 1B is a top view showing a state where a cap of the light-emitting module shown in FIG. 1A is removed.
Figure 1C:
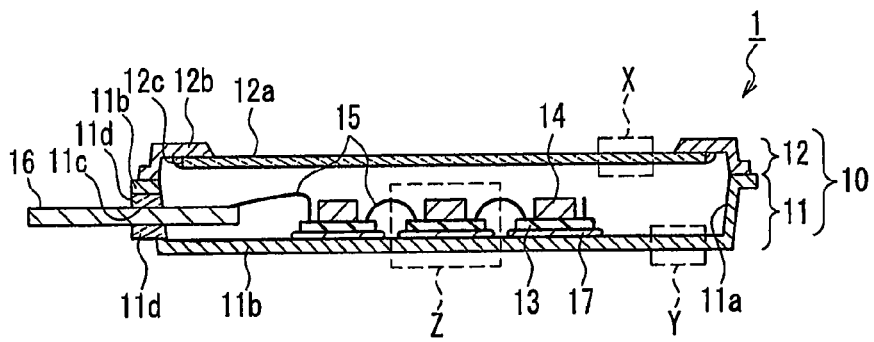
FIG. 1C is a cross-sectional view taken along a line I-I in FIG. 1A.
Figure 1D:
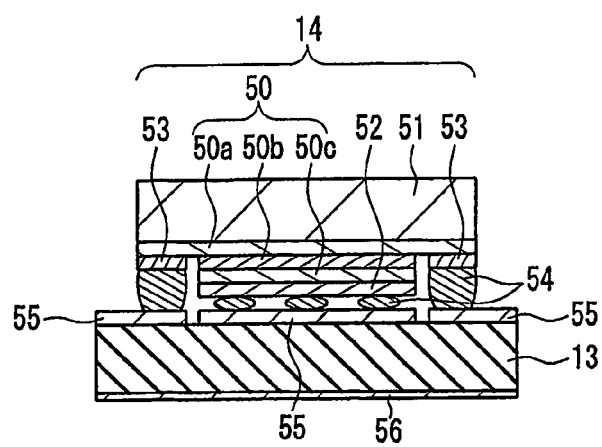
FIG. 1D is an enlarged cross-sectional view of an LED chip and a base board used for the light-emitting module shown in FIG. 1C.

First, a light-emitting module according to Embodiment 1 of the present invention will be described with reference to the drawings. FIGS. 1A to 1D are views illustrating the light-emitting module according to Embodiment 1. Among them, FIG. 1A is a top view of the light-emitting module according to Embodiment 1, FIG. 1B is a top view showing a state where a cap of the light-emitting module shown in FIG. 1A is removed, FIG. 1C is a cross-sectional view taken along a line I-I in FIG. 1A, and FIG. 1D is an enlarged cross-sectional view of an LED chip and a base board used in the light-emitting module shown in FIG. 1C.

As shown in FIG. 1C, the light-emitting module 1 according to Embodiment 1 includes a package 10 having a base 11 with a concave portion 11a, and a cap 12 connected to the base 11. The base 11 may be connected to the cap 12, for example, by performing seam welding (welding using a pulse current of about several amperes) under the condition that outer edges of the base 11 and the cap 12 are pressed in an inert gas atmosphere. Furthermore, as shown in FIG. 1A, a plurality of base boards 13 and LED chips 14 each including a semiconductor multi-layered film 50 (see FIG. 1D) provided on the base boards 13 are accommodated in the package 10. Furthermore, as shown in FIG. 1B, the LED chips 14 are connected electrically to each other via feed terminals 55 (see FIG. 1D) provided on the base boards 13 and wires 15. Furthermore, two terminal portions 16 for supplying electricity to the LED chips 14 are connected electrically to the LED chips 14 via the wires 15 and the feed terminals 55 (see FIG. 1D) provided on the base boards 13. In the present embodiment, although two terminal portions 16 are used, the present invention is not limited thereto, and three or more terminal portions 16 may be used depending upon the arrangement state and connection state of the LED chips 14.

As shown in FIG. 1C, the base 11 includes a metallic support portion 11b supporting the base boards 13, two through-holes 11c (only one is shown in FIG. 1C) for insertion of the respective terminal portions 16 provided on a side surface of the base 11, and an insulating member 11d formed on an outer circumference of the through-holes 11c, keeping electrical insulation between the metallic support portion 11b and the terminal portions 16, and between the respective terminal portions 16. Furthermore, each base board 13 is attached onto the metallic support portion 11b via solder 17. The base board 13 is made of an inorganic heat-dissipating material keeping electrical insulation between the LED chip 14 and the metallic support portion 11b. Furthermore, the cap 12 includes a window portion 12a through which at least a part of light emitted from the LED chip 14 (i.e., the light-emitting layer 50b shown in FIG. 1D) passes, a frame portion 12b provided on an outer circumference of the window portion 12a, and a connecting member 12c connecting the window portion 12a to the frame portion 12b.

As shown in FIG. 1D, the LED chip 14 includes the semiconductor multi-layered film 50, an n-GaN substrate 51 supporting the semiconductor multi-layered film 50, and electrodes 52 and 53 provided on the semiconductor multi-layered film 50. The semiconductor multi-layered film 50 is composed of an n-type semiconductor layer 50a, a light-emitting layer 50b, and a p-type semiconductor layer 50c stacked successively from the n-GaN substrate 51 side. The electrode 52 is formed in contact with the p-type semiconductor layer 50c, and the electrode 53 is formed in contact with the n-type semiconductor layer 50a. Then, the electrodes 52, 53 are connected electrically to the feed terminals 55 provided on the base board 13 via Au bumps 54. Furthermore, the surface of the base board 13 in contact with the solder 17 (see FIG. 1C) is covered with a Ti/Au plated film 56. As a constituent element of the electrode 52, it is preferable to use a material (e.g., Rh/Pt/Au, etc.) that reflects at least a part of light emitted from the light-emitting layer 50b. The light emitted from the light-emitting layer 50b can be reflected to the window portion 12a (see FIG. 1C), so that the efficiency of taking out light of the light-emitting module 1 is enhanced. The electrode 52 in this case corresponds to the above-mentioned "second light reflective layer". The constituent element of the electrode 53 is not particularly limited, and for example, Ti/Au or the like can be used. As a constituent element of the feed terminal 55, for the same reason as that in the case of the electrode 52, it is preferable to use a material (e.g., Ti/Pt/Al, etc.) that reflects at least a part of light emitted from the light-emitting layer 50b.

According to the light-emitting module 1 thus configured, heat generated from the LED chip 14 can be dissipated via the base board, the Ti/Au plated film 56, the solder 17, and the metallic support portion 11b. Furthermore, the base board 13 is made of an inorganic material, so that the light-emitting module 1 having high heat resistance and light stability can be obtained. Furthermore, since the through-holes 11c are provided on a side surface of the base 11, the LED chips 14 can be supplied with electricity from the side surface of the base 11. This can bring a heat-dissipating member (not shown) into direct contact with the bottom surface of the base 11 (bottom surface of the metallic support portion 11b), so that the heat dissipation of the light-emitting module 1 can be kept satisfactorily. In order to suppress metal migration accelerated with moisture in the package 10, it is preferable that dry gas (dry air, dry nitrogen gas, dry argon gas, etc.) is sealed in the package 10.

Next, an exemplary material for each constituent element in the light-emitting module 1, and an exemplary dimension of the light-emitting module 1 will be described. Metal with a thermal expansion coefficient of $5\times10^{-6}/°$ C. to $1\times10^{-5}/°$ C. is used preferably for the metallic support portion 11b and the frame portion 12b. As such metal, for example, Kovar (Trade Mark of Westinghouse Elec. Corp.) that is an ion-nickel-cobalt alloy can be exemplified. For example, borosilicate glass can be used for the insulating member 11d and the window portion 12a. Particularly, in the case of using Kovar as a constituent element of the frame portion 12b, when borosilicate glass is used as the constituent element of the window portion 12a, the difference between the thermal expansion coefficient of Kovar and the thermal expansion coefficient of borosilicate glass is small, so that the damage to the connection portion between the window portion 12a and the frame portion 12b can be prevented. Glass having a low melting point such as PbO, for example, can be used for the connecting member 12c. Furthermore, AlN, sapphire, or the like, for example, can be used for the base board 13. Furthermore, regarding the dimension of the package 10, for example, the package 10 that is 25 mm per side and has a thickness of about 3 mm can be used. In the case of using borosilicate glass for the window portion 12a, Kovar for the frame portion 12b, and glass with a low-melting point for the connecting member 12c, when the window portion 12a is connected to the frame portion 12b, first, the connection portion with respect to the window portion 12a in the frame portion 12b is plated with nickel, and the film plated with nickel is coated with glass fine particles (connecting member 12c) having a low melting point. Then, the window portion 12a is attached to the frame portion 12b via the glass fine particles having a low melting point, and thereafter, they are connected by heating at about 400° C.

An exemplary material for each constituent element in the light-emitting module 1, and an exemplary dimension of the light-emitting module 1 have been described. However, they may be set appropriately depending upon the application of the light-emitting module 1. For example, in the above example, borosilicate glass is exemplified as the constituent element of the window portion 12a, and Kovar is exemplified as the constituent element of the frame portion 12b. However, as long as the difference between the thermal expansion coefficient of the constituent element of the window portion 12a and the thermal expansion coefficient of the constituent element of the frame portion 12b is $1\times10^{-6}/°$ C. or lower, even if materials other than those exemplified above are used, the damage to the connection portion between the window portion 12a and the frame portion 12b can be prevented.

Furthermore, in order to fix the bottom portion of the base 11 onto a heat-dissipating member (not shown) stably, the height of the base 11 may be set to be 5 mm or less, and the smallest width of the base 11 may be set to be twice or more the height of the base 11. Furthermore, in order to ensure the strength of the connection portion between the base 11 and the cap 12, each thickness of portions to be connected of the base 11 and the cap 12 is preferably 0.3 to 1 mm, and more preferably 0.5 to 1 mm. Furthermore, in order to ensure the mechanical strength of the base 11 while maintaining the satisfactory heat dissipation of the heat generated from the LED chip 14, the thickness of the bottom portion of the base 11 is preferably 0.1 to 0.3 mm, and more preferably 0.1 to 0.2 mm.

Furthermore, in the above embodiment, an example in which an LED bare chip is mounted on a base board made of AlN by flip chip bonding has been described. However, the combination of the LED bare chip (or the semiconductor multi-layered film) and the base board that can be used in the present invention are not limited thereto. For example, a GaN-based LED bare chip (hereinafter, referred to as a "general-purpose LED bare chip") in which a GaN-based semiconductor multi-layered film is epitaxially grown on an inorganic insulating substrate (e.g., a sapphire substrate, etc.) having heat dissipation may be used. In this configuration, the inorganic insulating substrate corresponds to the base board.

Furthermore, an LED bare chip may be mounted on a submount substrate made of AlN, $Al_2O_3$, high-purity Si, or the like by flip chip bonding. In this configuration, the submount substrate corresponds to the base board. In this case, it is not necessary that the entire constituent element of the submount substrate is composed of an electrical insulating material, as long as the electrical insulation between the LED bare chip and the metallic support portion can be kept. For example, as the submount substrate, a low-resistant semiconductor Si substrate in which at least one principal plane is covered with an inorganic insulting film such as a $SiO_2$ film can be used.

Furthermore, according to a method disclosed by JP 2004-14938 A and the like, a submount substrate (base board) made of AlN, $Al_2O_3$, high-purity Si, or the like can be used, in which a semiconductor multi-layered film is mounted under the condition that a single crystal substrate used for epitaxially growing the semiconductor multi-layered film is removed.

Furthermore, a semiconductor SiC substrate on which the above-mentioned general-purpose LED bare chip is mounted also can be used. In this configuration, if the general-purpose LED bare chip is mounted with the inorganic insulating substrate side thereof directed to the semiconductor SIC substrate, electrical insulation between the semiconductor multi-layered film of the general-purpose LED bare chip and the metallic support portion can be kept. In this case, the inorganic insulating substrate of the general-purpose LED bare chip and the semiconductor SiC substrate correspond to the base board.

Furthermore, a metallic submount substrate made of copper, aluminum, or the like with the above-mentioned general-purpose LED bare chip mounted thereon also can be used. In this configuration, if the general-purpose LED bare chip is mounted with the inorganic insulating substrate side directed to the metallic submount substrate, the electrical insulation between the semiconductor multi-layered film of the general-purpose LED bare chip and the metallic support portion can be kept. In this case, the inorganic insulating substrate of the general-purpose LED bare chip and the metallic submount substrate correspond to a base board. Furthermore, an electrical insulating layer made of enamel or the like may be provided on at least one principal plane of the metallic submount substrate.

Figure 2A:
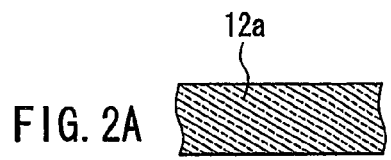
FIGS. 2A to 2G are enlarged cross-sectional views showing variations in details of the light-emitting module according to Embodiment 1 of the present invention. Among them.
Figure 2B:
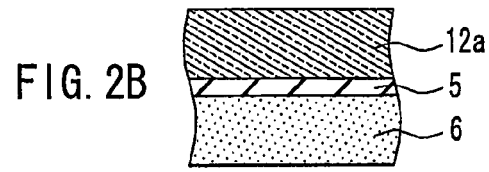
Figure 2C:
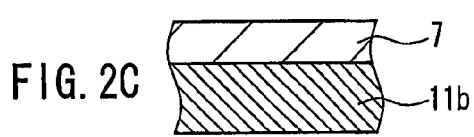
Figure 2D:
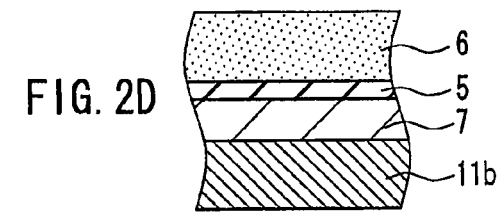
Figure 2E:
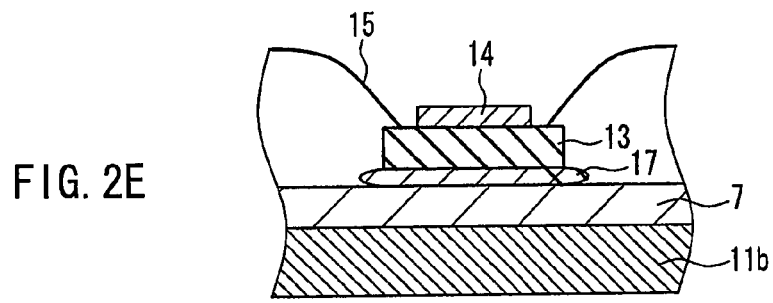
Figure 2F:
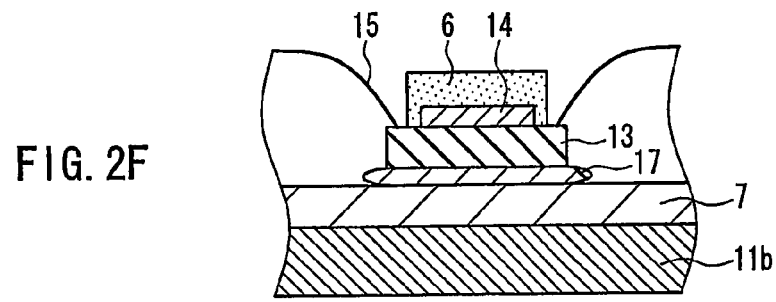
Figure 2G:
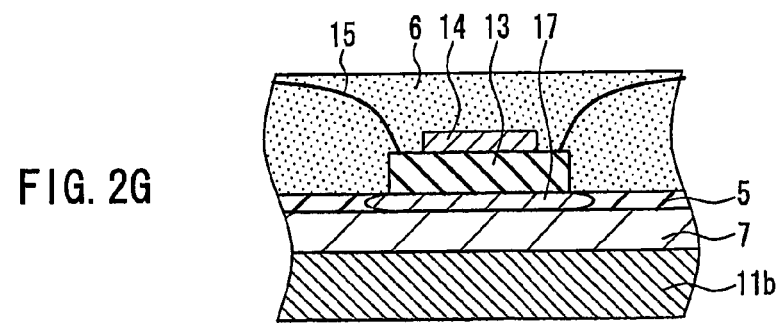

Next, the variations in details of the above-mentioned light-emitting module 1 will be described with reference to the drawings. FIGS. 2A to 2G are enlarged cross-sectional views showing the variations in details of the light-emitting module 1. Among them, FIGS. 2A and 2B are enlarged cross-sectional views showing a variation in an X-portion in FIG. 1C. FIGS. 2C and 2D are enlarged cross-sectional views showing a variation in a Y-portion in FIG. 1C. FIGS. 2E to 2G are enlarged cross-sectional views showing a variation in a Z-portion in FIG. 1C. In FIGS. 2A to 2G, the same constituent elements as those in FIGS. 1A to 1D are denoted with the same reference numerals as those therein, and the description thereof will be omitted.

The X-portion in FIG. 1C can be configured only using the window portion 12a as shown in FIG. 2A, for example, in the case where the light-emitting module 1 is used as a w-light source. On the other hand, in the case where the light-emitting module 1 is used as a visible light source, as shown in FIG. 2B, the metal oxide layer 5 and the phosphor layer 6 may be stacked successively on the inner surface of the window portion 12a. According to this configuration, the phosphor layer 6 absorbs at least a part of light from the LED chip 14 to emit fluorescence, whereby white light, for example, can be taken out. Therefore, the light-emitting module 1 suitable for a lighting apparatus can be obtained. Furthermore, for example, in the case where the phosphor layer 6 contains a phosphor excited with UV-light, the UV-light passing through the phosphor layer 6 can be reflected to the phosphor layer 6 side by the metal oxide layer 5. Therefore, the excitation efficiency of the phosphor layer 6 can be enhanced. Furthermore, the metal oxide layer 5 is provided on the inner surface of the window portion 12a, so that the output of UV-light (harmless light) from the window portion 12a can be prevented. Because of this, when the light-emitting module 1 is used as a visible light source, the safety can be ensured.

The Y-portion in FIG. 1C may be configured using only the metallic support portion 11b. However, as shown in FIG. 2C, a first light reflective layer 7 that reflects at least a part of light from the LED chip 14 may be provided on the metallic support portion 11b. The light emitted from the LED chip 14 can be reflected to the window portion 12a side, so that the efficiency of taking out light of the light-emitting module 1 is enhanced. In this case, when metal (about 100 to 500 W/(m·K)) having a high heat conductivity such as Au, Ag, or Al is used as the constituent element of the first light reflective layer 7, the heat dissipation of the light-emitting module 1 also can be enhanced. Furthermore, as shown in FIG. 2D, when the metal oxide layer 5 and the phosphor layer 6 are stacked successively on the first light reflective layer 7, the same effect as that of FIG. 2B also can be obtained.

As shown in FIG. 2E, the Z-portion in FIG. 1C may include the metallic support portion 11b, the first light reflective layer 7 stacked on the metallic support portion 11b, the base board 13 attached to the first light reflective layer 7 via the solder 17, and the LED chip 14 provided on the base board 13. For example, in the case where the light-emitting module 1 is used as a white light source, as shown in FIG. 2F, a phosphor layer 6 covering the LED chip 14 may be provided in addition to the configuration in FIG. 2E. Furthermore, in the case where the Y-portion in FIG. 1C has a configuration shown in FIG. 2D, as shown in FIG. 2G, the phosphor layer 6 covering the LED chip 14, the base board 13, and the metal oxide layer 5 may be provided.

Next, exemplary methods for forming the above-mentioned metal oxide layer 5 and the phosphor layer 6 will be described. First, an exemplary method for forming the metal oxide layer 5 will be described. Metal oxide fine particles (e.g., alumina fine particles, etc.) are dispersed in a solvent (water, nitrocellulose, etc.) to prepare a slurry, and the slurry is applied to a desired portion of an inner wall of the package 10, using means such as spraying or spin coating. After this, the slurry is dried at hundreds of degrees for about 30 minutes, whereby the metal oxide layer 5 is obtained. The thickness of the metal oxide layer 5 can be increased by repeating this operation. Furthermore, the metal oxide layer 5 also can be made multi-layered by repeating the above operation using a plurality of kinds of metal oxide fine particles.

Then, an exemplary method for forming the phosphor layer 6 will be described. First, according to a first method, metal alkoxide (methyl silicate, N-butyl silicate, etc.) is hydrolyzed to be solated. After this, the viscosity of the sol thus obtained is adjusted to a predetermined value using alcohols such as ethylene glycol, and a phosphor is dispersed in the sol to prepare a paste. Then, the paste is applied to a desired portion of an inner wall of the package 10, and dried at 200° C. for tens of minutes and heated at 300° C. for about 2 hours, whereby the phosphor layer 6 bound by, for example, $SiO_2$ is obtained. According to a second method, phosphorus oxide, boron oxide, or the like to be a binder, and a phosphor are dispersed in a solvent such as terpineol to prepare a paste. Then, the paste is applied to a desired portion of an inner wall of the package 10, and heated at about 300° C., whereby the phosphor layer 6 is obtained. According to a third method, a paste in which a phosphor is dispersed in a sol-shaped silicone resin is applied to a desired portion of an inner wall of the package 10, and cured (gelled) by heating at about 150° C., whereby the phosphor layer 6 is obtained. According to the second or third method, in the case where a paste is applied by screen printing, when ultra-fine particles (particle size: about 1 to 500 nm) of a metal oxide (e.g., silica, etc.) are dispersed in the paste to provide thixotropy, the phosphor layer 6 can be formed in a desired shape in accordance with a screen stencil plate. Furthermore, in the case of using the first, second, or third method, by adding fine particles (particle size: about 1 to 5 μm) of a metal oxide (e.g., titania, etc.) to the paste, light output from the phosphor layer 6 thus obtained scatters, so that the distribution of light output from the phosphor layer 6 can be made uniform.

Figure 3A:
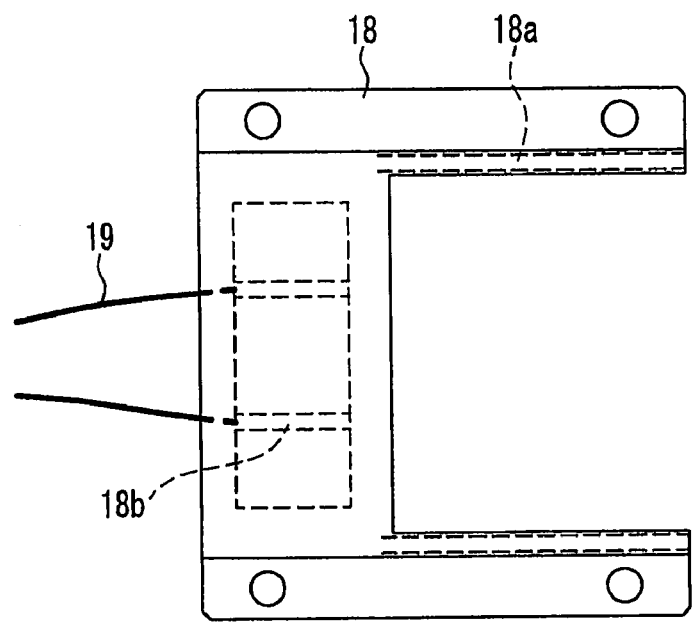
FIGS. 3A to 3D are views illustrating a light-emitting apparatus using the light-emitting module according to Embodiment 1 of the present invention. Among them.
Figure 3B:
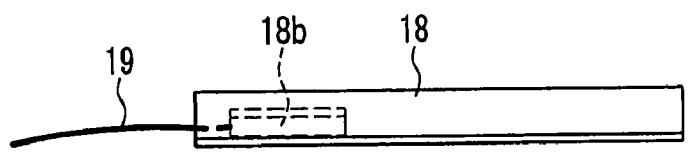
Figure 3C:
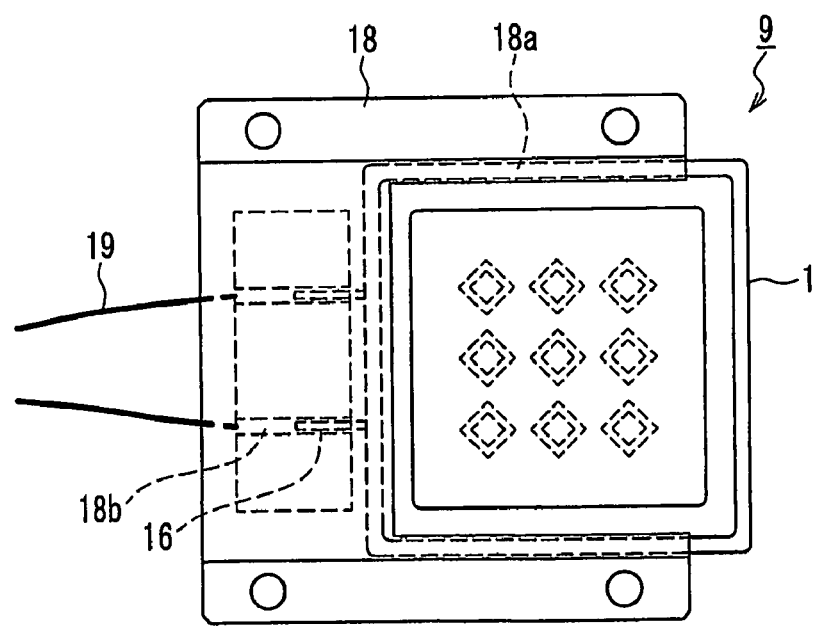
Figure 3D:
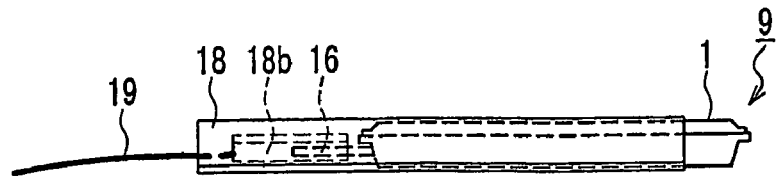

Next, an example in which the light-emitting module 1 according to Embodiment 1 is used for a light-emitting apparatus will be described with reference to the drawings. FIGS. 3A to 3D are views illustrating the light-emitting apparatus using the light-emitting module 1 according to Embodiment 1. Among them, FIG. 3A is a top view of a socket; FIG. 3B is a side view thereof, FIG. 3C is a top view showing a state where the light-emitting module 1 according to Embodiment 1 is inserted in the socket in FIG. 3A; and FIG. 3D is a side view showing a state where the light-emitting module 1 according to Embodiment 1 is inserted in the socket in FIG. 3B. In FIGS. 3A to 3D, the same constituent elements as those of FIGS. 1A to 1D are denoted with the same reference numerals as those therein, and the description thereof will be omitted.

A socket 18 used in the light-emitting apparatus 9 (see FIGS. 3C and 3D) includes a guide groove 18a, and terminal insertion portions 18b in which the terminal portions 16 (see FIG. 3C) are inserted, as shown in FIGS. 3A and 3B. Furthermore, cables 19 to be connected electrically to the terminal portions 16 are inserted in the terminal insertion portions 18b. Herein, the positions of the guide groove 18a and the terminal insertion portions 18b are regulated at a precision of, for example, about ±0.1 mm. Because of this, when the light-emitting module 1 is inserted in the socket 18, by sliding the light-emitting module 1 along the guide groove 18a, the terminal portions 16 can be inserted in the terminal insertion portions 18b, as shown in FIGS. 3C and 3D.

Embodiment 2

Figure 4A:
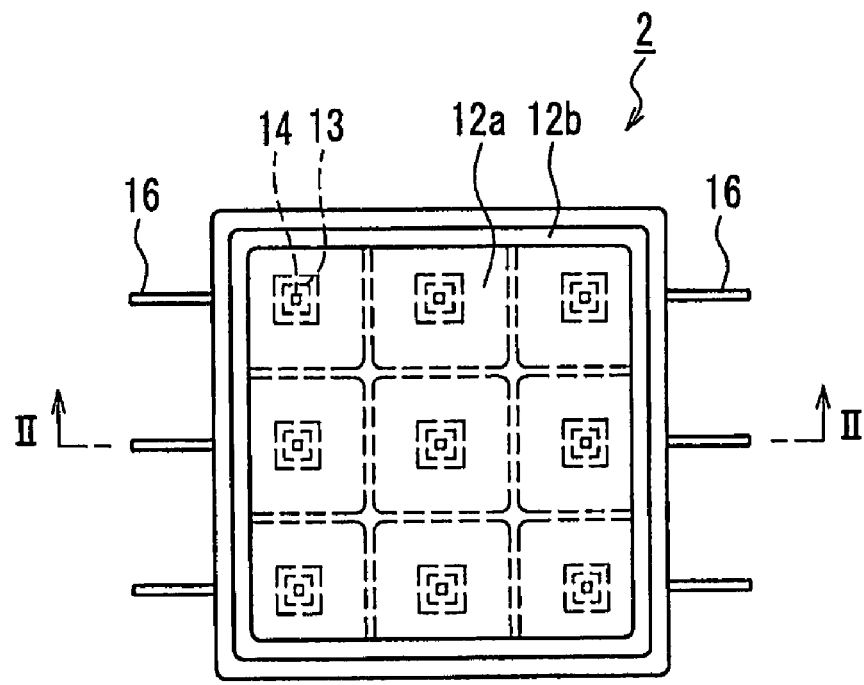
FIG. 4A is a top view of a light-emitting module according to Embodiment 2 of the present invention.
Figure 4B:
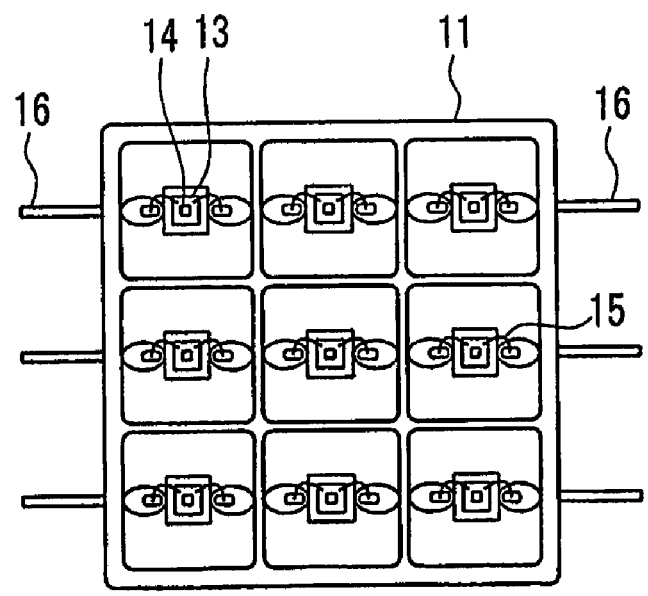
FIG. 4B is a top view showing a state where a cap of the light-emitting module shown in FIG. 4A is removed.
Figure 4C:
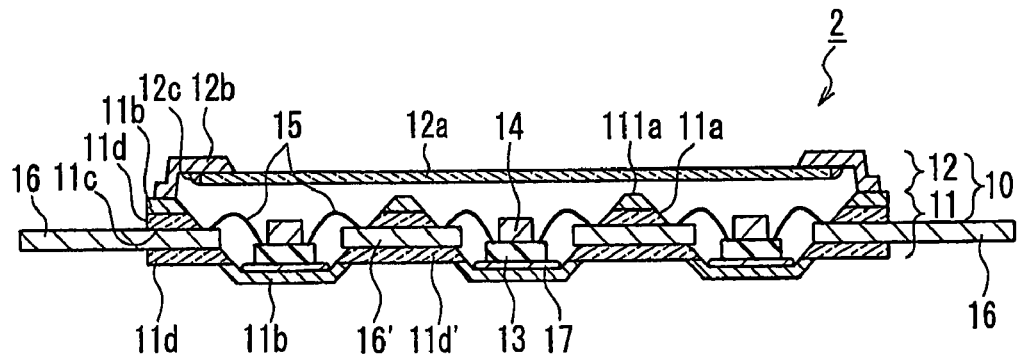
FIG. 4C is a cross-sectional view taken along a line II-II in FIG. 4A.

Next, a light-emitting module according to Embodiment 2 of the present invention will be described with reference to the drawings. FIGS. 4A to 4C are views illustrating a light-emitting module according to Embodiment 2. Among them, FIG. 4A is a top view of the light-emitting module according to Embodiment 2; FIG. 4B is a top view showing a state where a cap of the light-emitting module shown in FIG. 4A is removed; and FIG. 4C is a cross-sectional view taken along a line II-II in FIG. 4A. In FIGS. 4A to 4C, the same constituent elements as those in FIGS. 1A to 1D are denoted with the same reference numerals as those therein, and the description thereof will be omitted.

Figure 4D:
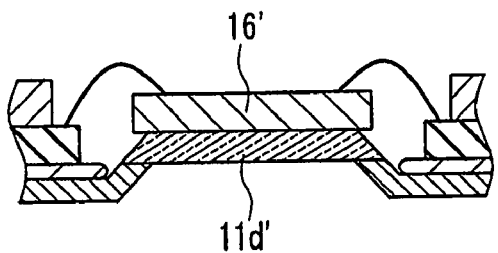
FIGS. 4D and 4E are partial cross-sectional views showing modified examples of the light-emitting module according to Embodiment 2 of the present invention.
Figure 4E:
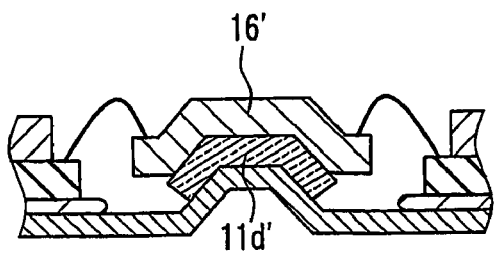

As shown in FIGS. 4A to 4C, a light-emitting module 2 according to Embodiment 2 is different from the light-emitting module 1 (see FIGS. 1A to 1D) according to Embodiment 1, in the connection state of the LED chips 14 and the number of the terminal portions 16. Furthermore, the concave portions 11a (see FIG. 4C) are provided in accordance with the number of the LED chips 14, and the respective LED chips 14 are separated by the concave portions 11a. Because of this, portions 111a (see FIG. 4C) partitioning the respective concave portions 11a function as beams, so that the mechanical strength of the package 10 is enhanced. Furthermore, each concave portion 11a has an inclined surface spreading to an opening side. Because of this, light emitted from the LED chip 14 can be reflected to the window portion 12a side, so that the efficiency of taking out light of the light-emitting module 2 is enhanced. Furthermore, the light-emitting module 2 further includes lead terminals 16' passing through insulating members 11d' placed between the respective concave portions 11a. Because of this, each LED chip 14 can be supplied with electricity via the lead terminal 16'. The remaining configuration is the same as that of the light-emitting module 1 according to Embodiment 1. Thus, the light-emitting module 2 according to Embodiment 2 also can exhibit the same effect as that of the light-emitting module 1 according to Embodiment 1. When the light-emitting module 2 according to Embodiment 2 is used in a light-emitting apparatus, the light-emitting apparatus can be configured, using two (a pair of) sockets that are the same as that shown in FIGS. 3A and 3B, except that the number of the terminal insertion portions 18b (see FIGS. 3A and 3B) is different. Furthermore, as shown in FIGS. 4D and 4E, the lead terminal 16' may be placed so as to traverse a portion that partitions the respective concave portions 11a via the insulating member 11d'.

Embodiment 3

Figure 5A:
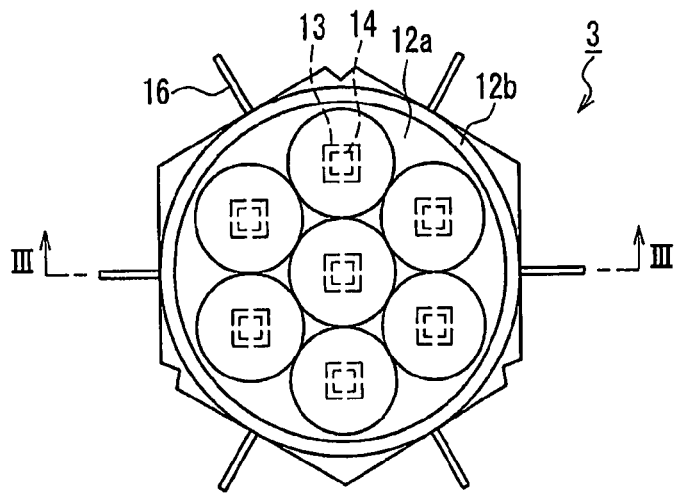
FIG. 5A is a top view of a light-emitting module according to Embodiment 3 of the present invention.
Figure 5B:
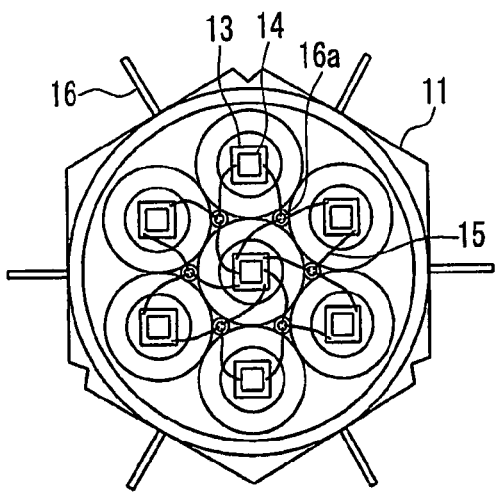
FIG. 5B is a top view showing a state where a cap of the light-emitting module shown in FIG. 5A is removed.
Figure 5C:
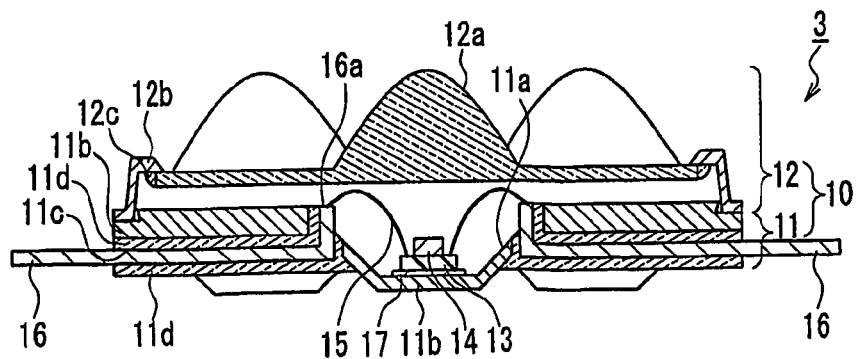
FIG. 5C is a cross-sectional view taken along a line III-III in FIG. 5A.

Next, a light-emitting module according to Embodiment 3 of the present invention will be described with reference to the drawings. FIGS. 5A to 5C are views illustrating the light-emitting module according to Embodiment 3. Among them, FIG. 5A is a top view of the light-emitting module according to Embodiment 3; FIG. 5B is a top view showing a state where a cap of the light-emitting module shown in FIG. 5A is removed; and FIG. 5C is a cross-sectional view taken along a line III-III in FIG. 5A. In FIGS. 5A to 5C, the same constituent elements as those in FIGS. 4A to 4C are denoted with the same reference numerals as those therein, and the description thereof will be omitted.

As shown in FIGS. 5A to 5C, a light-emitting module 3 according to Embodiment 3 is different from the light-emitting module 2 (see FIGS. 4A to 4C) according to Embodiment 2, in the number of the LED chips 14, the arrangement state of the LED chips 14, the connection state of the LED chips 14, and the shape of the package 10. Furthermore, as shown in FIG. 5C, the through-hole 11c is formed in an L-shape, and an L-shaped terminal portion 16 is inserted in the through-hole 11c. Furthermore, the respective LED chips 14 are connected electrically via ends 16a (see FIGS. 5B and 5C) positioned in the package 10 in the terminal portions 16. Furthermore, in the window portion 12a, a lens condensing light emitted from the LED chips 14 is formed. The remaining configuration is the same as that of the light-emitting module 2 according to Embodiment 2. Thus, the light-emitting module 3 according to Embodiment 3 also can exhibit the same effect as that of the light-emitting module 2 according to Embodiment 2.

Next, an example in which the light-emitting module 3 according to Embodiment 3 is used in a light-emitting apparatus will be described with reference to the drawings. FIGS.

Figure 6A:
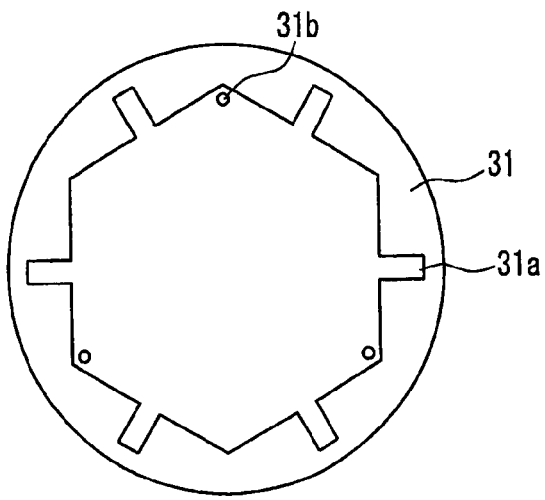
FIGS. 6A to 6D are views illustrating a light-emitting apparatus using a light-emitting module according to Embodiment 3 of the present invention. Among them.
Figure 6B:
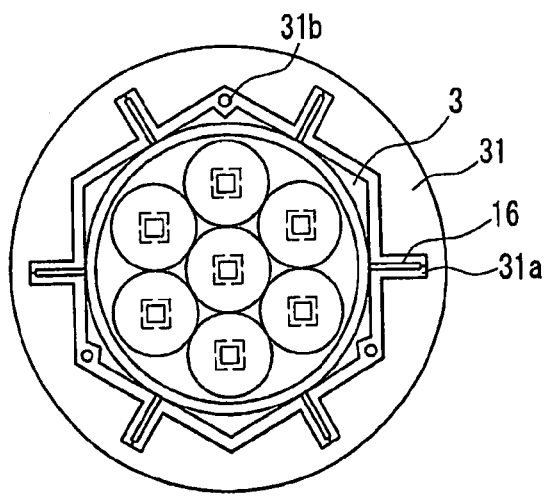
Figure 6C:
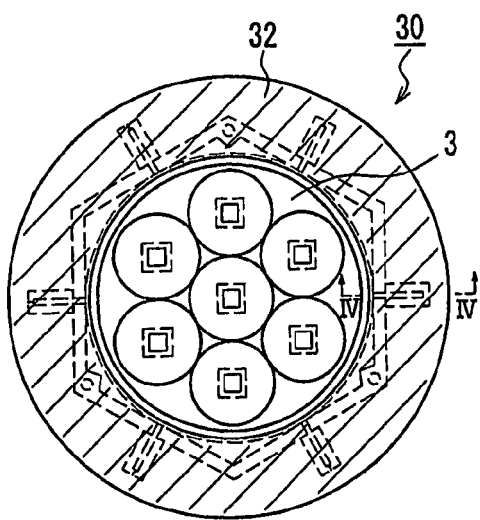
Figure 6D:
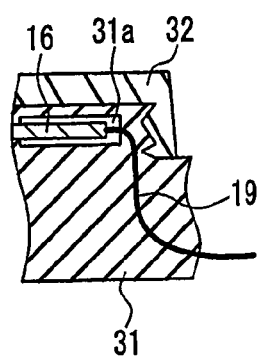

6A to 6D are views illustrating the light-emitting apparatus using the light-emitting module 3 according to Embodiment 3. Among them, FIG. 6A is a top view of a socket; FIG. 6B is a top view showing a state where the Light-emitting module 3 according to Embodiment 3 is inserted in the socket in FIG. 6A; FIG. 6C is a top view showing a state where a pressure cover further is attached to the state in FIG. 6B; and FIG. 6D is a cross-sectional view taken along a line IV-IV in FIG. 6C. In FIGS. 6A to 6D, the same constituent elements as those in FIGS. 5A to 5C are denoted with the same reference numerals as those therein, and the description thereof will be omitted.

As shown in FIG. 6A, a socket 31 used in the light-emitting apparatus 30 (see FIG. 6C) includes terminal insertion portions 31a in which the terminal portions 16 (see FIG. 6B) are inserted, and position regulating pins 31b. A cable 19 (see FIG. 6D) connected electrically to the terminal portion 16 is inserted in the terminal insertion portion 31a. When the light-emitting apparatus 30 is configured, the light-emitting module 3 is placed on the socket 31 so that the terminal portions 16 of the light-emitting module 3 are inserted in the terminal insertion portions 31a of the socket 31, as shown in FIG. 6B. At this time, the positions of the terminal portions 16 and the terminal insertion portions 31a are regulated by the position regulating pins 31b, so that the light-emitting module 3 can be attached without misunderstanding the electrical polarity. Then, as shown in FIG. 6C, a pressure cover 32 is attached to the socket 31 (see FIG. 6B). A screw portion is provided respectively in the socket 31 and the pressure cover 32, as shown in FIG. 6D. Therefore, the socket 31 and the pressure cover 32 can be fixed by screwing.

Embodiment 4

Figures 7A, 7B:
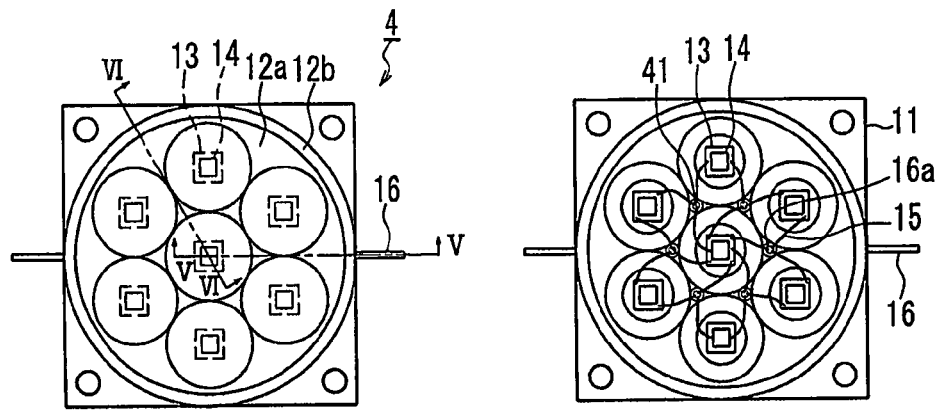
FIG. 7A is a top view of a light-emitting module according to Embodiment 4 of the present invention.
FIG. 7B is a top view showing a state where a cap of the light-emitting module in FIG. 7A is removed.
Figure 7C:
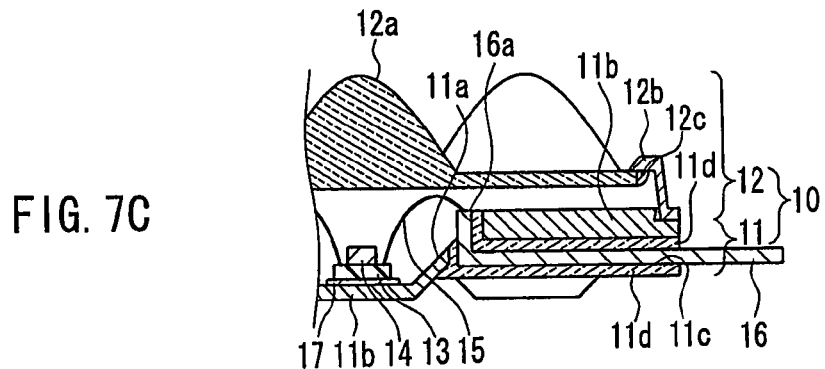
FIG. 7C is a cross-sectional view taken along a line V-V in FIG. 7A.
Figure 7D:
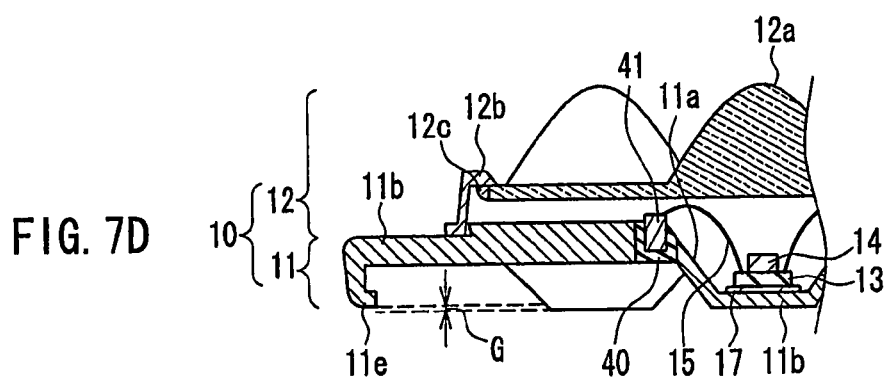
FIG. 7D is a cross-sectional view taken along a ling VI-VI in FIG. 7A.

Next, a light-emitting module according to Embodiment 4 of the present invention will be described with reference to the drawings. FIGS. 7A to 7D are views illustrating the light-emitting module according to Embodiment 4. Among them, FIG. 7A is a top view of the light-emitting module according to Embodiment 4; FIG. 7B is a top view showing a state where a cap of the light-emitting module shown in FIG. 7A is removed; FIG. 7C is a cross-sectional view taken along a line V-V in FIG. 7A; and FIG. 7D is a cross-sectional view taken along a line VI-VI in FIG. 7A In FIGS. 7A to 7D, the same constituent elements as those in FIGS. 5A to 5C are denoted with the same reference numerals as those therein, and the description thereof will be omitted.

Figures 7E, 7F:
FIGS. 7E and 7F are partial cross-sectional views showing modified examples of the light-emitting module according to Embodiment 4 of the present invention.

As shown in FIGS. 7A and 7B, the light-emitting module 4 according to Embodiment 4 is different from the light-emitting module 3 (see FIGS. 5A to 5C) according to Embodiment 3, in the number of the terminal portions 16 and the shape of the package 10. As shown in FIGS. 7B to 7D, the respective LED chips 14 are connected electrically to each other via ends 16a of the terminal portions 16 (see FIG. 7C), and relay terminal portions 41 (see FIGS. 7B and 7D) formed in an insulating member 40 (see FIG. 7D) positioned in a region surrounded by the concave portion 11a. Furthermore, as shown in FIG. 7D, a projection 11e is provided at a circumferential portion of the base 11. Because of this, when the light-emitting module 4 is used in a light-emitting apparatus 42 (see FIGS. 8A and 8B) described later, the contact between the circumferential portion of the base 11 and a heat-dissipating member 43 (see FIGS. 8A and 8B) is enhanced. The shape of the projection 11e is not limited to the above embodiment, and the same effect can be exhibited even with, for example, the shapes as shown in FIGS. 7E and 7F. A gap G (see FIG. 7D) between the bottom surface of the base 11 and the tip end surface of the projection 11e is, for example, in a range of 0.1 to 0.2 mm. The remaining configuration is the same as that of the light-emitting module 3 according to Embodiment 3. Even the light-emitting module 4 according to Embodiment 4 can exhibit the same effect as that of the light-emitting module 3 according to Embodiment 3.

Figure 8A:
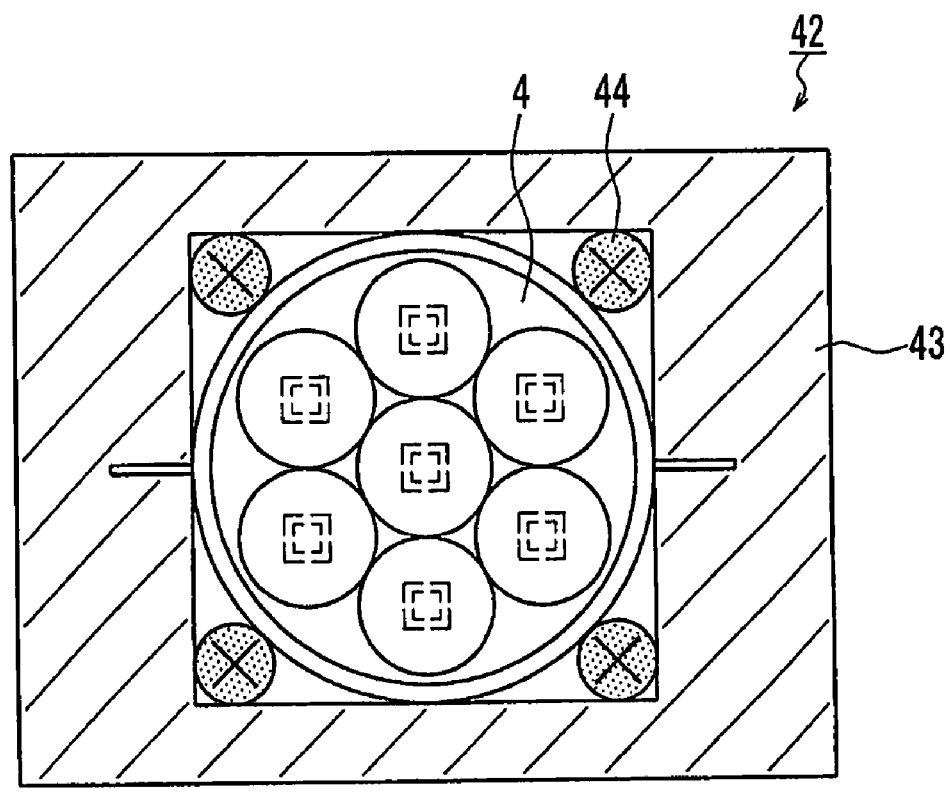
FIGS. 8A and 8B are views illustrating a light-emitting apparatus using the light-emitting module according to Embodiment 4 of the present invention. Among them.
Figure 8B:
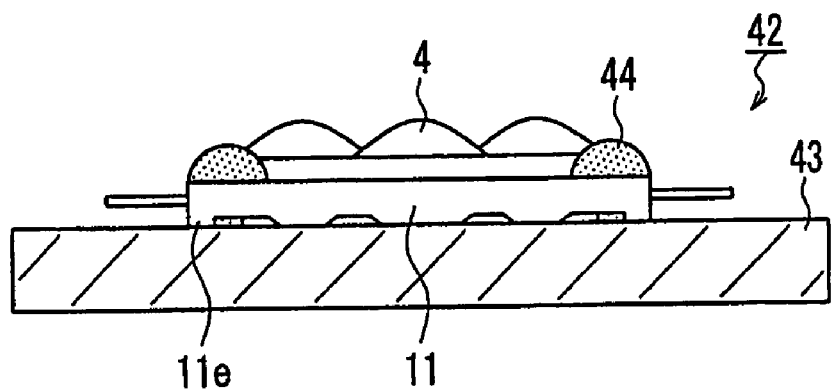

Next, an example in which the light-emitting module 4 according to Embodiment 4 is used for a light-emitting apparatus will be described with reference to the drawings. FIGS. 8A and 8B are views illustrating the light-emitting apparatus using the light-emitting module 4 according to Embodiment 4. Among them, FIG. 8A is a top view of the light-emitting apparatus, and FIG. 8B is a side view thereof. In FIGS. 8A and 8B, the same constituent elements as those in FIGS. 7A to 7D are denoted with the same reference numerals as those therein, and the description thereof will be omitted.

As shown in FIGS. 8A and 8B, the light-emitting apparatus 42 includes the heat-dissipating member 43 made of metal or the like, and the light-emitting module 4 fixed on the heat-dissipating member 43 with a screw 44. Furthermore, as described above, the projection 11e (see FIG. 8B) is provided at a circumferential portion of the base 11 of the light-emitting module 4. Therefore, when the light-emitting module 4 is fixed on the heat-dissipating member 43 with a screw, the circumferential portion of the base 11 is bent, whereby the contact between the metallic support portion 11b immediately below the LED chip 14 (see FIG. 7D) and the heat-dissipating member 43 is enhanced. Because of this, the heat dissipation of the light-emitting apparatus 42 is enhanced.

INDUSTRIAL APPLICABILITY

The light-emitting module of the present invention is useful in, for example, a lighting apparatus used in general lighting, presentation lighting (a sign light, etc.), automobile lighting (in particular, a headlight), or the like; a display apparatus used in a large display for a street, a projector, or the like; and a light source (in particular, a UV-light source) used in a disinfecting apparatus, a cleaning apparatus, a deodorizing apparatus, a light-exposure apparatus, and a resin-curing lamp, or the like.

The invention claimed is:

1. A light-emitting module accommodating a base board with a semiconductor multi-layered film mounted in a package wherein the semiconductor multi-layered film includes a light-emitting layer, the package includes a base and a cap connected to the base, the base is made of a metallic support portion having a concave portion, the metallic support portion has a plurality of through-holes on a side surface of the concave portion, terminal portions are inserted in the through-holes via glass that is an electrically insulating member, the semiconductor multi-layered film is electrically connected to the terminal portions via wires, the base board is supported on a bottom section of the concave portion, a face of the bottom section of the concave portion on a side where the base board is mounted and a face on an opposite side thereof are planes, the cap includes a glass window portion and a frame portion provided on an outer circumference of the glass window portion, the metallic support portion and the frame portion have a thermal expansion coefficient of $5 \times 10^{-6}/^\circ$C. to $1 \times 10^{-5}/^\circ$C., a difference in thermal expansion coefficient between the glass window portion and the frame portion is $1 \times 10^{-6}$/°C. or less, projections to be subjected to seam welding to each other are provided at an outer circumferential portion of an upper part of the concave portion and an outer circumferential portion of the frame portion.

2. The light-emitting module according to claim 1, wherein the concave portion has an inclined surface spreading to an opening side.

3. The light-emitting module according to claim 1, wherein light emitted from the light emitting layer has a wavelength in a range of 200 nm to 540 nm.

4. The light-emitting module according to claim 1, further comprising a metal oxide layer provided on an inner surface of the glass window portion.

5. The light-emitting module according to claim 1, further comprising a phosphor layer that is provided on at least a part of an inner wall of the package, and absorbs at least a part of light emitted from the light-emitting layer to emit fluorescence.

6. The light-emitting module according to claim 5, further comprising a metal oxide layer that is interposed between at least a part of the inner wall of the package and the phosphor layer.

7. The light-emitting module according to claim 1, further comprising a first light reflective layer that is provided on at least a part of an inner wall of the package excluding the glass window portion and reflects at least a part of light emitted from the light-emitting layer.

8. The light-emitting module according to claim 1, further comprising a second light reflective layer that is interposed between the base board and the semiconductor multi-layered film, and reflects at least a part of light emitted from the light-emitting layer.

9. The light-emitting module according to claim 1, wherein dry gas is sealed in the package.

10. The light-emitting module according to claim 1, wherein the base board is made of an inorganic heat-dissipating material having electrical insulation of a heat conductivity of 100 to 500 W/(m·K).

11. The light-emitting module according to claim 1, wherein the base board is made of any material selected from AlN, $Al_2O_3$, Si, and SiC.

12. The light-emitting module according to claim 1, wherein a thickness of a bottom portion of the base is 0.1 to 0.3 mm, and each thickness of portions to be connected of the base and the cap is 0.3 to 1 mm.

13. The light-emitting module according to claim 1, wherein a thickness of the base is 5 mm or less, and a smallest width of the base is twice or more the height of the base.

14. The light-emitting module according to claim 1, wherein a plurality of second concave portions are provided on the bottom section of the concave portion of the base,
a plurality of the base boards are supported in the respective second concave portions,
the second concave portions adjacent to each other are partitioned by beams,
each of the beams includes an insulating member and a lead terminal passing through the insulating member, and
the lead terminal protrudes into the second concave portions on both sides of the beam.

15. The light-emitting module according to claim 1, wherein the terminal portion protrudes from the package, and the light-emitting module is fixed while pressing down the terminal portions protruding from the package.

16. The light-emitting module according to claim 1, wherein the glass window portion at a position corresponding to the base board is a convex portion.

17. The light-emitting module according to claim 1, wherein the light-emitting module includes a plurality of semiconductor multi-layered films each mounted on a respective base board in a package.

18. The light-emitting module according to claim 1, wherein the base portion is continuously made of metal except for the through-holes, the frame portion being made of metal, the base portion extending upwardly to meet the frame portion.

19. The light-emitting module according to claim 1, wherein a bottom surface of the light emitting module is made entirely of metal.

* * * * *